United States Patent [19]

Guth

[11] Patent Number: 5,222,305

[45] Date of Patent: Jun. 29, 1993

[54] METHOD FOR SPECIFYING AND VERIFYING POSITIVE GRAPHICS PATTERN POSITIONS RELATIVE TO NON-PLATED TOOLING HOLES PATTERNS ON THE SAME SUBSTRATE

[75] Inventor: Lloyd A. Guth, San Diego, Calif.

[73] Assignee: Hughes Aircraft Company, Los Angeles, Calif.

[21] Appl. No.: 857,868

[22] Filed: Mar. 26, 1992

[51] Int. Cl.$^5$ .............................................. B23Q 3/00
[52] U.S. Cl. ........................................ 33/614; 33/623
[58] Field of Search ................. 33/614, 1 B, 623, 645, 33/613, 615, 616

[56] References Cited

U.S. PATENT DOCUMENTS

| | | | |
|---|---|---|---|
| 2,871,572 | 2/1959 | Gutzmer | 33/614 |
| 3,160,096 | 12/1964 | Norton | 33/623 |
| 3,368,439 | 2/1968 | Bungay, Jr. | 33/614 |
| 4,670,981 | 6/1987 | Kubota et al. | 33/614 |
| 4,700,488 | 10/1987 | Curti | 33/614 |
| 4,805,316 | 2/1989 | Curti | 33/614 |
| 4,977,683 | 12/1990 | Harder | 33/623 |
| 4,981,076 | 1/1991 | Cunill | 33/614 |
| 5,133,256 | 7/1992 | Keaton | 33/614 |

Primary Examiner—William A. Cuchlinski, Jr.
Assistant Examiner—C. W. Fulton
Attorney, Agent, or Firm—Randall M. Heald; Charles D. Brown; Wanda K. Denson-Low

[57] ABSTRACT

A method of specifying and verifying tight toleranced positional accuracies of external conductive patterns on electronic substrates relative to non-plated tooling hole patterns in the same substrate comprising the addition of round plated or otherwise deposited disks incorporated into the conventional plated art work of the substrate. These disks are positioned at the exact ideal location of each tooling hole. When the substrate manufacturing process is complete and the tooling holes have been drilled through at a correct location, the tooling hole will be positioned within the area of each disk on the substrate. If the tooling hole or holes is/are drilled at an unacceptable location, i.e. outside of the area of the disk, then the component receiving non-plated tooling holes, plated through holes and plated lands will also be miss-positioned and the substrate is discarded. When the tooling holes are properly aligned it is now assured that the non-plated tooling holes and solder lands of each of two or more stacked substrates are properly aligned to accept various components which may extend from one stacked substrate to another.

3 Claims, 1 Drawing Sheet

METHOD FOR SPECIFYING AND VERIFYING POSITIVE GRAPHICS PATTERN POSITIONS RELATIVE TO NON-PLATED TOOLING HOLES PATTERNS ON THE SAME SUBSTRATE

BACKGROUND OF THE INVENTION

The invention is directed to the manufacture of substrates and particularly to the alignment of non-plated tooling holes and solder lands in substrates that interface with one another or are stacked one on the other with the connection leads of various mutually common components extending to solder lands on the respective stacked substrates with the common component positioned by one or more aligned holes in the stacked substrates.

One commonly employed state of the art method for insuring the required alignment of non-plated tooling holes in substrates employs an indirect technique wherein the conductive pattern's position location is first controlled relative to plated-through holes (PTH) which if present are located within the bounds of conductive patterns. This is accomplished in accordance with industry accepted standards as established by ANSI Y144.5, Mil-Std-275 and IPC-D-275 (IPC). The PTH's are then in turn used to control the position of the non-plated through hole (NPTH) pattern. This in effect is a stepping stone process which makes the use of two well established location control practices commonly used in the art. This method introduces large quantities of positional variances inherent with the stepping stone process of the indirect technique. This method forces the control of feature relationships, i.e. the conductive pattern to PTH relationship and the PTH to NPTH relationship, which, in themselves, may not, and generally are not, of any value. In tight tolerance applications, this technique is totally ineffective and impractical. Substrates fabricated via this technique require the use of additional special alignment fixtures at the next step of assembly to ensure proper fit and alignment. This is inconvenient and economically costly.

Another state of the art method entails laborious inspection processes, mandating meticulous and time consuming measurements of pertinent pattern feature sizes and physical positions relative to the tooling hole pattern. Although this method is feasible in tight toleranced applications, the method relies on individualized practices of specifying and verifying the conductive pattern to tooling hole relationships. This method, is vulnerable to misinterpretation and requires the use of unconventional and specialized inspection equipment and skills at the substrate's acceptance stages. This technique consequently is also inconvenient and economically costly.

There has not been a convenient and economically inexpensively method of insuring the positional accuracy of non-plated tooling hole pattern relative to external solder pads until the emergence of the instant invention.

SUMMARY OF THE INVENTION

The solution to the above inadequacies of the current state of the art alignment of non-plated tooling holes in substrates is overcome by the following method.

The method of the instant invention includes the incorporation of "Graphic Pattern Targets" (GPT) into the conductive pattern art work on the surface of the substrate. The GPTs are round solid disks, large dots of a predetermined size, which are incorporated into otherwise conventional art work of the substrate's conductive pattern art work. The GPTs are positioned, one each coincidentally onto the centers of each of the pertinent non-plated tooling holes. When the conductive patterns of the substrate are generated, included with it will be the unique GPT, one positioned at the ideally exact location of each tooling hole.

The tooling holes, when properly fabricated, i.e. proper size and location, during the substrate manufacturing process, will each be located totally within the confines of their respective GPT. If the tooling holes and conductive patterns are not within the specific positional tolerance of one another, one or more of the tooling holes will break out of the outer circumference of its respective GPT.

The advantage of this improved method for specifying and verifying positive graphic patterns relative to non-plated tooling hole patterns are at least three fold.

Positional requirements of the conductive pattern can be specified and verified directly relative to the non-plated tooling holes, i.e. the stepping stone process is not required, using accepted and well established conventional methods for specifying the requirements.

A simple visual inspection is all that is required to verify the acceptability of the tooling hole positions relative to location DET the conductive pattern, i.e. via the GPT. This advantage significantly reduces the effort and thereby the economic cost to inspect fabricated substrates.

Product producibility can be enhanced by taking advantage of conductive pattern under-etch occurrences. If conductive pattern features are under-etched, i.e. conductive pattern features are at larger permissible limit of size, the tooling hole pattern's positional variation can be increased making the substrate easier to fabricate and hence less economically costly to make.

A principal object of this invention is to provide a quick visible method of verifying that non-plated through tooling holes in substrates are precisely aligned relative to the conductive surfaces thereon so that these holes and solder lands will be aligned between one or more stacked substrates.

Other objects and features of the invention will become apparent as the drawings which follow are understood by reading the corresponding description thereof.

BRIEF DESCRIPTION OF THE DRAWING FIGURES

DETAILED DESCRIPTION OF THE PREFERRED EMBODIMENT

Figure 1:
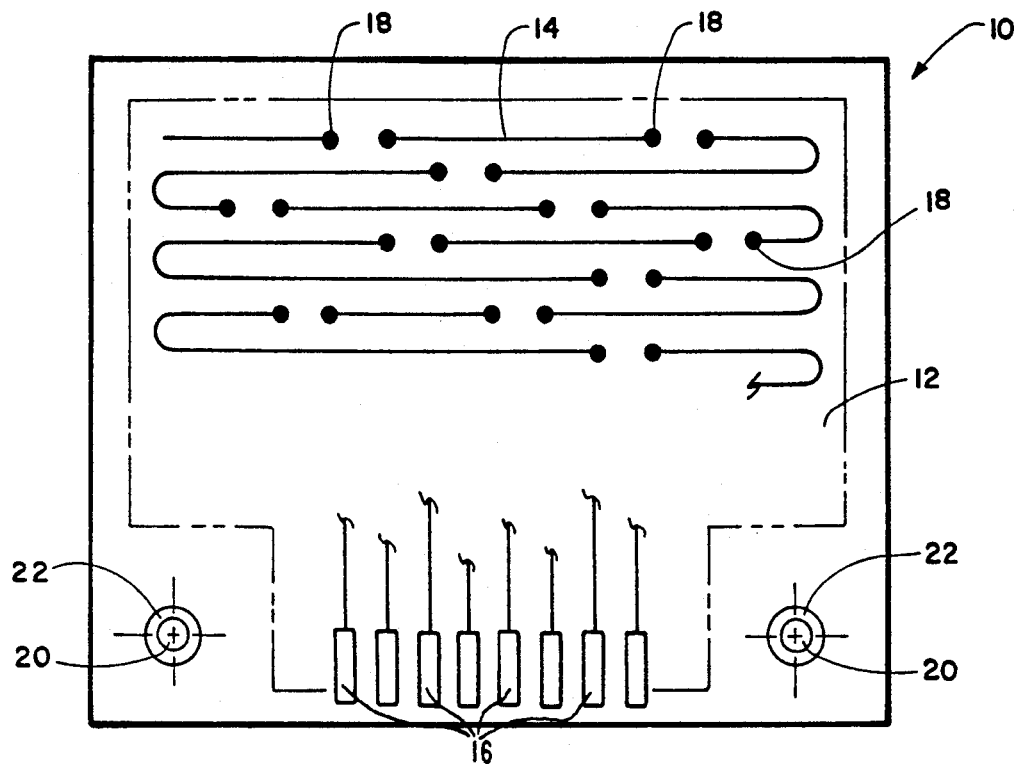
FIG. 1 is a plan view depicting the tooling holes and graphic pattern targets of the instant invention.

Referring now to the drawing figures, and specifically to FIG. 1, a substrate 10 which is manufactured according to methods which are well known in this art. At least the upper surface 12 includes a conventionally plated conductive pattern of circuit component connector paths 14 which includes substrate contact connector lands 16, i.e. solder lands, which at least of which are connected to the conductive pattern 14 for inputs and outputs to and from the substrate circuit.

It should be understood that as the substrate is manufactured various holes 18 are drilled through the substrate 10 some of which are plated through for electrical connection of components and interconnection to another substrate positioned above or below the substrate 10 and not shown, some for mounting components which are merely drilled through and not plated and tooling hole's 20 which are used for positioning the finished substrate for the automatic loading of components and/or stacking, and circuit and component mounting and interconnecting between stacked substrates. The tooling holes register or vertically align stacked substrates for component and final assembly loading therebetween as well as the position of individual substrates for loading. If the solder lands or plated through or drilled through holes of vertically stacked substrates are misaligned when tooled into position by the tooling holes 20 it will be impossible to load and interconnect the vertically positioned substrates and the misaligned substrates must be discarded and replaced with properly aligned substrates.

Figure 2:
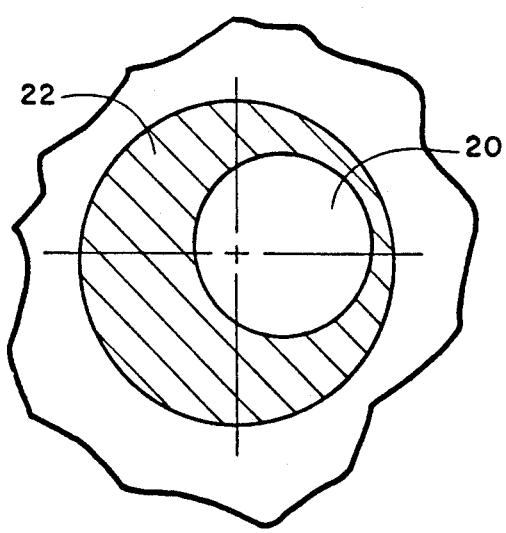
FIG. 2 is a showing depicting a graphic pattern target with a properly located tooling hole therethrough indicating an acceptable conductive pattern to tooling hole relationship.

During the normal plating process of the conductive surface of the subs&:rate, conductive disks or pads 22 are plated on the substrates concurrent with conductive patterns, i.e. solder lands, and positioned so as to coincide coaxially with the location of the tooling holes that were drilled into the substrate during manufacture. The surface area of the disks 22 are selectively sized such that when a given size tooling hole is drilled through the disk 22 if the tooling hole is within the surface area of the disk, best seen in drawing FIG. 2, then the relative positioning of the conductive pattern and all of the tooling hole's drilled through the substrate are then within their required position tolerance.

Figure 3:
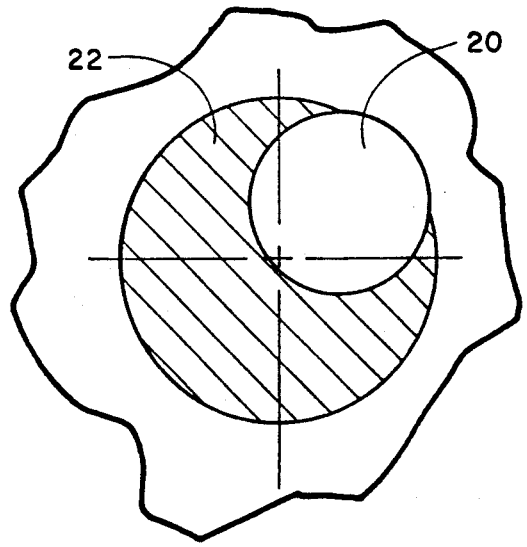
FIG. 3 is a showing depicting a graphic pattern target with a misaligned tooling hole therethrough indicating an unacceptable conductive pattern to tooling hole relationship.

Substrate having tooling holes 20 cutting through the outside of the disk 22, as shown in drawing FIG. 3, denote misalignment of the tooling hole plated through or drilled through the substrate. Substrates with this misalignment condition are discarded.

As shown in drawing FIG. 1, two disks and associated tooling holes are shown. It should be understood that one or more disks and tooling holes may be utilized on a given substrate to ensure the positioning tolerances of the substrate conductive patterns and essential drilled through non-plated tooling holes.

While a specific embodiment of the device of the present invention has been shown and fully explained above for the purpose of illustration it should be understood that many alterations, modifications and substitutions may be made to the instant invention disclosure without departing from the spirit and scope of the invention as defined by the appended claims.

What is claimed is:

1. A method for verifying positive graphic pattern positioning on a substrate comprising the steps of;
   providing a substrate with a conductive pattern thereon and precisely located component holes, plated through holes and drilled holes and tooling holes therethrough;
   providing at least one conductive disk on said substrate during the plating of said conductive pattern thereon; and
   verifying that said at least one of said tooling holes and said at least one conductive disk are substantially coaxial whereby when at least one of said tooling holes falls within the surface area of said at least one disk said graphic pattern is properly positioned.

2. The method as defined in claim 1 including the additional step of sizing the surface area of said at least one disk relative to the diameter of said at least one tooling hole so that when said at least one tooling hole falls within said surface area of said at least one disk all of said plated through holes and said drilled through holes are properly aligned relative to said conductive surface on said substrate.

3. The method as defined in claim 1 wherein said at least one disk is a plurality of disks and at least one tooling hole is a plurality of tooling holes.

* * * * *